United States Patent
Xu (10) Patent No.: US 10,038,430 B2
(45) Date of Patent: Jul. 31, 2018

(54) SYSTEM FOR CONTROLLIING GATINGS OF A MULTI-CORE PROCESSOR

(71) Applicant: NVIDIA CORPORATION, Santa Clara, CA (US)

(72) Inventor: Shuang Xu, Shenzhen (CN)

(73) Assignee: NVIDIA CORPORATION, Santa Clara, CA (US)

( * ) Notice: Subject to any disclaimer, the term of this patent is extended or adjusted under 35 U.S.C. 154(b) by 538 days.

(21) Appl. No.: 13/747,023

(22) Filed: Jan. 22, 2013

(65) Prior Publication Data

US 2014/0125401 A1    May 8, 2014

(30) Foreign Application Priority Data

Nov. 9, 2012   (CN) .......................... 2012 1 0445948

(51) Int. Cl.
*H03K 17/00*   (2006.01)
*H03K 5/00*   (2006.01)

(52) U.S. Cl.
CPC ..................................... *H03K 5/00* (2013.01)

(58) Field of Classification Search
CPC ....................................................... H03K 5/00
USPC ....... 327/365, 378, 172–176, 262, 512, 513; 713/500
See application file for complete search history.

(56) References Cited

U.S. PATENT DOCUMENTS

| | | | | |
|---|---|---|---|---|
| 5,073,838 | A * | 12/1991 | Ames | ............................ 361/103 |
| 7,256,632 | B2 * | 8/2007 | Chen et al. | .................... 327/175 |
| 2008/0141062 | A1 * | 6/2008 | Yamaoka | ........................ 713/501 |
| 2009/0265498 | A1 * | 10/2009 | Yamaoka | ........................ 710/305 |

FOREIGN PATENT DOCUMENTS

CN           1854958 A      11/2006

* cited by examiner

*Primary Examiner* — Thomas Skibinski
(74) *Attorney, Agent, or Firm* — Artegis Law Group, LLP (57) ABSTRACT

A system for controlling gatings of a multi-core processor, the system includes a pulse width modulation generator for generating a control square wave; and a phase shifter for shifting a phase of the control square wave to generate control square waves with different phases, and respectively inputting the control square waves with the different phases to a gating of each of multiple processing engines in the multi-core processor. A multi-core processor is provided that includes multiple processing engines. Each processing engine includes a gating, and a system for controlling the gating. Accordingly, in the multi-core processor, the load to be processed in a certain period of a working cycle can be averaged to be processed in a longer period of the working cycle. Consequently, current noise and voltage noise and temperature growth due to the load change can be reduced.

21 Claims, 4 Drawing Sheets

SYSTEM FOR CONTROLLIING GATINGS OF A MULTI-CORE PROCESSOR

CROSS-REFERENCE TO RELATED APPLICATIONS

This application claims priority to Chinese Patent Application No. 201210445948.9, filed on Nov. 7, 2012, which is hereby incorporated herein by reference.

BACKGROUND OF THE INVENTION

Field of the Invention

The present invention generally relates to a multi-core processor, and more specifically, to a system for controlling gatings of a multi-core processor and a multi-core processor.

Description of the Related Art

With the development of computer technology, a multi-task environment is generally involved when a computer is used by a user, wherein multi-media tasks such as games have more and more requirements for performance of a processor. A traditional single-core processor cannot meet the computing performance requirement of new applications which is increasingly developed because of the restriction of performance and manufacturing process, and the like. The processing capacity of a multi-core processor is significantly better than that of a single-core processor. A "horizontal scalability" method is involved by multi-core processor technology, wherein an application is divided into multiple threads which are assigned to a number of processing engines within a multi-core processor to execute in parallel, thereby providing a new solution for performance problem. Graphics processing unit (GPU) is a typical multi-core processor, for example, there are thousands of parallel processing engines (CUDA Core) in GPU architecture of Nvidia.

During normal operation of a multi-core processor, the loads on it change with different processing tasks. The load change could lead to significant current transient in the multi-core processor because the multi-core processor contains billions of transistors. A GPU current transient frequency could typically be in a range of 1 KHz~16 KHz and then leads to vibration of output inductors of a DC-DC power regulator at a corresponding frequency. This vibration may be amplified and transformed into annoying acoustics noise by a printed circuit board (PCB). Moreover, the die temperature of a multi-core processor might be rising up to 6° C. per second while the multi-core processor starts running an application from idle. Because of the sharply increasing of the temperature, the bump/ball of the multi-core processor package might be cracked due to different thermal expansion of materials. Furthermore, the above described current transient could result in voltage noise in the multi-core processor. In order to solve the above problems, the clock frequency of a multi-core processor is generally reduced to decrease the amplitude of load transient and the influence thereof in turn in the prior art. However, the processing performance degradation of the multi-core processor could be incurred because the clock frequency is reduced.

Therefore, what is needed in the art is a system for decreasing the amplitude of load transient without the performance degradation when the load change happens on a multi-core processor, thereby solving the above problems.

SUMMARY OF THE INVENTION

The present invention is related to a system for controlling gatings of a multi-core processor and a multi-core processor.

In one aspect of the invention, a system for controlling gatings of a multi-core processor, including: a pulse width modulation generator for generating a control square wave; and a phase shifter for shifting a phase of the control square wave to generate control square waves with different phases, and respectively inputting the control square waves with the different phases to a gating of each of multiple processing engines in the multi-core processor.

Optionally, the phases of the control square waves with the different phases are different from each other.

Preferably, the phases of the control square waves with the different phases are in an arithmetic progression.

In a preferred embodiment of the present invention, the system further includes a status monitor for monitoring status of the multi-core processor and generating status information based on the monitored status; wherein the control square wave is generated based on the status information.

In a preferred embodiment of the present invention, the status monitor includes a temperature monitor for monitoring a temperature of the multi-core processor and generating the status information based on the monitored temperature; and the pulse width modulation generator is further used for computing a temperature growth rate based on the status information; wherein when the temperature growth rate is larger than a threshold, a duty cycle of the control square wave is decreased; when the temperature growth rate is equal to or lower than the threshold, the duty cycle of the control square wave is increased.

In a preferred embodiment of the present invention, the status monitor includes a load monitor for monitoring a utilization rate of at least one of the multiple processing engines and generating the status information based on the monitored utilization rate; wherein a duty cycle of the control square wave is adjusted based on the status information, so that a utilization rate of the multi-core processor is kept at a desired value.

Preferably, the status monitor includes a temperature monitor and a load monitor; wherein the temperature monitor is used for monitoring a temperature of the multi-core processor and generating first status information based on the monitored temperature; the load monitor is used for monitoring a utilization rate of at least one of the multiple processing engines and generating second status information based on the monitored utilization rate; and the pulse width modulation generator is further used for computing a temperature growth rate based on the first status information; wherein, when the temperature growth rate is equal to or lower than a threshold, a duty cycle of the control square wave is adjusted based on the second status information, so that a utilization rate of the multi-core processor is kept at a desired value; when the temperature growth rate is larger than the threshold, the duty cycle of the control square wave is decreased.

Preferably, the load monitor further includes: an active processing engine counter for monitoring utilization rates of at least two of the multiple processing engines and computing a comprehensive utilization rate of the multi-core processor based on the utilization rates of the at least two of the multiple processing engines; a utilization rate controller for generating the second status information based on the comprehensive utilization rate.

In a preferred embodiment of the present invention, the multiple processing engines are divided into multiple groups and each of the control square waves with the different phases is respectively used for being input to gatings of processing engines in a corresponding group.

Preferably, the number of the groups is eight; and the phase shifter is further used for shifting the phase of the control square wave to generate eight control square waves with phases which are in an arithmetic progression with a 45° common difference, and inputting each of the eight control square waves with the phases which are in the arithmetic progression with the 45° common difference to the gatings of the processing engines in the corresponding group.

In another aspect of the invention, a multi-core processor is provided, including:

multiple processing engines, wherein each processing engine includes a gating;

a system for controlling the gating, further including:

a pulse width modulation generator for generating a control square wave; and a phase shifter for shifting a phase of the control square wave to generate control square waves with different phases, and respectively inputting the control square waves with the different phases to the gating of the each processing engine.

Optionally, the phases of the control square waves with the different phases are different from each other.

Preferably, the phases of the control square waves with the different phases are in an arithmetic progression.

In a preferred embodiment of the present invention, the system for controlling the gating further includes: a status monitor for monitoring status of the multi-core processor and generating status information based on the monitored status, wherein the control square wave is generated based on the status information.

In a preferred embodiment of the present invention, the status monitor includes a temperature monitor for monitoring a temperature of the multi-core processor and generating the status information based on the monitored temperature; and the pulse width modulation generator is further used for computing a temperature growth rate based on the status information; wherein, when the temperature growth rate is larger than a threshold, a duty cycle of the control square wave is decreased; when the temperature growth rate is equal to or lower than the threshold, the duty cycle of the control square wave is increased.

In a preferred embodiment of the present invention, the status monitor includes a load monitor for monitoring a utilization rate of at least one of the multiple processing engines and generating the status information based on the monitored utilization rate; wherein a duty cycle of the control square wave is adjusted based on the status information, so that a utilization rate of the multi-core processor is kept at a desired value.

In a preferred embodiment of the present invention, the status monitor includes a temperature monitor and a load monitor; wherein the temperature monitor is used for monitoring a temperature of the multi-core processor and generating first status information based on the monitored temperature; the load monitor is used for monitoring a utilization rate of at least one of the multiple processing engines and generating second status information based on the monitored utilization rate; and the pulse width modulation generator is further used for computing a temperature growth rate based on the first status information; wherein, when the temperature growth rate is equal to or lower than a threshold, a duty cycle of the control square wave is adjusted based on the second status information, so that a utilization rate of the multi-core processor is kept at a desired value; when the temperature growth rate is larger than the threshold, the duty cycle of the control square wave is decreased.

Preferably, the load monitor further includes: an active processing engine counter for monitoring utilization rates of at least two of the multiple processing engines and computing a comprehensive utilization rate of the multi-core processor based on the utilization rates of the at least two of the multiple processing engines; a utilization rate controller for generating the second status information based on the comprehensive utilization rate.

In a preferred embodiment of the present invention, the multiple processing engines are divided into multiple groups and each of the control square waves with the different phases is respectively input to gatings of processing engines in a corresponding group.

Preferably, the number of the groups is eight; and the phase shifter is further used for shifting the phase of the control square wave to generate eight control square waves with phases which are in an arithmetic progression with a 45° common difference, and inputting each of the eight control square waves with the phases which are in the arithmetic progression with the 45° common difference to the gatings of the processing engines in the corresponding group.

The system for controlling gatings of a multi-core processor and the multi-core processor provided by the present invention result that load transient may not be simultaneous on different processing engines of a multi-core processor while a load change happens on the multi-core processor. Accordingly, for a multi-core processor, the load to be processed in a certain period of a working cycle can be averaged to be processed in a longer period of the working cycle. Consequently, current noise and voltage noise and temperature growth due to the load change can be reduced.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Example embodiments are described herein in the context of systems for controlling gatings of multi-core processors and multi-core processors. Those of ordinary skill in the art will realize that the following description is illustrative only and is not intended to be in any way limiting. Other embodiments will readily suggest themselves to those skilled in the art having the benefit of this disclosure. Reference will now be made in detail to implementations of the example embodiments as illustrated in the accompanying drawings. The same reference numbers will be used to the extent possible throughout the drawings and the following description to refer to the same or like items.

Figure 1:
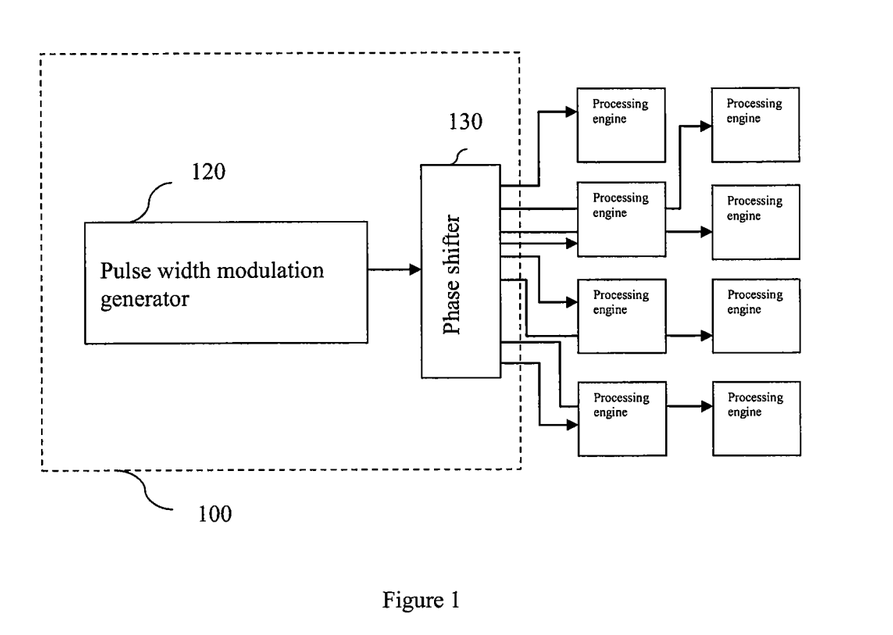
FIG. 1 illustrates a system for controlling gatings of a multi-core processor, according to one embodiment of the present invention.

FIG. 1 illustrates a system 100 for controlling gatings of a multi-core processor, according to one embodiment of the present invention. As shown in FIG. 1, the system 100 for controlling gatings of the multi-core processor includes a pulse width modulation generator 120 and a phase shifter 130.

The pulse width modulation generator 120 is used for generating a control square wave. The phase shifter 130 is used for shifting a phase of the control square wave to generate control square waves with different phases, and respectively inputting the control square waves with the different phases to a gating of each of multiple processing engines in the multi-core processor.

Preferably, the frequency of the control square wave generated by the pulse width modulation generator 120 is in a range of 20 KHz~30 KHz. Since a human audible frequency range is about 20 Hz~20 KHz, using a control square wave with such a frequency range by a circuit can avoid acoustics noise when the circuit is in operation.

Optionally, the phases of the control square waves with the different phases are different from each other. Since the different control square waves have the different phases in time domain, these control square waves can make different processing engines be enabled at different time via the gatings of the processing engines, so that the load processing on the multi-core processor can be arranged at different periods of a whole working cycle as far as possible. Accordingly, load transient can be smoothed on the whole working cycle, thus avoiding the significant load transient on some periods.

Figure 2:
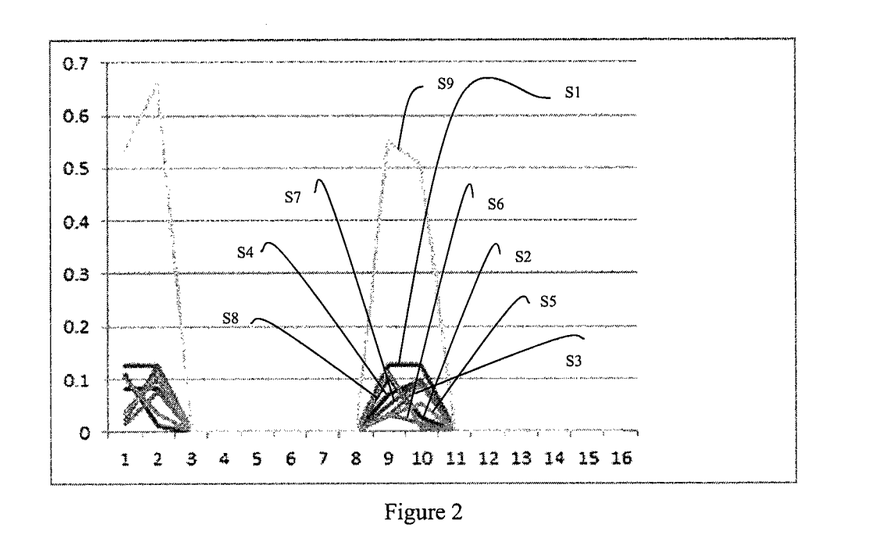
FIG. 2 illustrates utilization rates of a multi-core processor with 8 processing engines wherein there is no phase shifting control.
Figure 3:
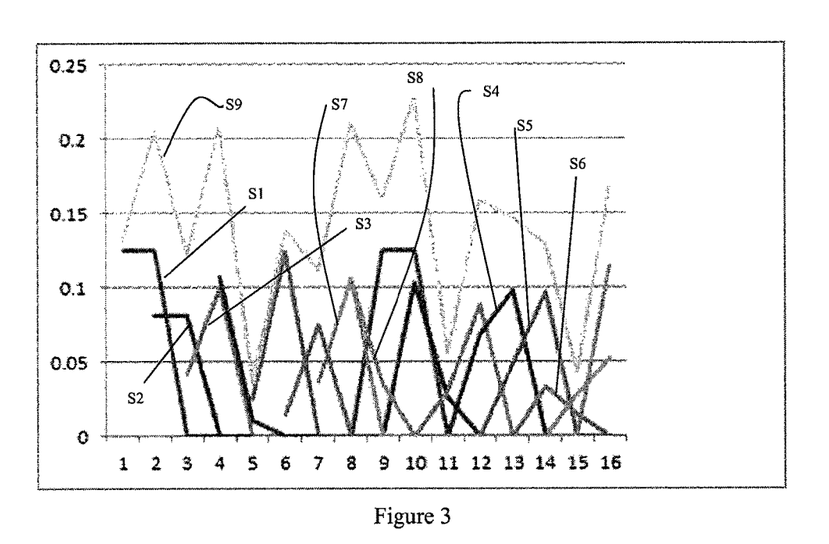
FIG. 3 illustrates utilization rates of a multi-core processor with 8 processing engines with shifting control wherein there are phase shifting controls, according to one embodiment of the present invention.

FIG. 2 illustrates utilization rates of a multi-core processor with eight processing engines wherein there is no phase shifting control. FIG. 2 illustrates the respective utilization rate S1 to S8 of each of the eight processing engines in the multi-core processor and the sum S9 of S1 to S8. The utilization rate of a processing engine is a ratio of its busy period to its enable period. As shown in FIG. 2, if there is no phase shifting control over the gatings of the multiple processing engines, the eight processing engines would be operated simultaneously in the period labeled by 0.5 to 2.5 and 7.5 to 10.5, which may allows that the sum S9 of the utilization rates S1 to S8 of the eight processing engines to be about 60%. FIG. 3 illustrates utilization rates of a multi-core processor with eight processing engines wherein there are phase shifting controls. As shown in FIG. 3, if there is phase shifting control over the gatings of the eight processing engines, the tasks to be processed by the eight processing engines in the period labeled by 0.5 to 2.5 would be averaged to be processed in the working cycle labeled by 0 to 8. Similarly, the tasks to be processed by the eight processing engines in the period labeled by 7.5 to 10.5 would be averaged to be processed in the working cycle labeled by 8 to 16. Thus, the sum S9 of the utilization rates S1 to S8 would be decreased to about 0.2. It can be known with the comparison of FIG. 2 and FIG. 3 that the sum of the utilization rates of the eight processing engines would be greatly decreased in a certain period of a working cycle by controlling the gatings of the multiple processing engines by control square waves with different phases, which are generated by shifting their phases by the phase shifter 130. That is, for a multi-core processor, the load processing in a certain period of a working cycle can be averaged to be processed in a longer period of the working cycle. Consequently, current noise and voltage noise and temperature growth due to the load change can be reduced.

Preferably, the phases of the control square waves with the different phases are in an arithmetic progression. Such arithmetic progression distribution can cause the loads on a multi-core processor to be more evenly distributed at the different periods of a whole working cycle. Specifically, as shown in FIG. 1, if the phase shifter 130 outputs eight control square waves with the different phases, there is a 45° phase difference between two adjacent control square waves. For example, provided that the frequency of the generated control square waves is 25 KHz, the 45° phase difference in time domain will produce a 5 millisecond time difference between two adjacent control square waves. Compared with the previously enabled processing engine respectively, the enable time of each processing engine can be delayed by 5 milliseconds by the control square waves with the 5 millisecond time difference via the gating of the processing engine.

The above described system 100 for controlling the gatings of the multi-core processor can make the multiple processing engines be enabled at different time. Therefore, this can force the multi-core processor to run without a full load in more time in the whole working cycle. That is, while some processing engines are busy, other processing engines may be idle. Thus, while a load change happens on the multi-core processor, the load may not be simultaneously processed on each processing engine. For the multi-core processor, the load to be processed in a certain period of a working cycle can be averaged to be processed in a longer period of the working cycle. Consequently, current noise and voltage noise and temperature growth due to the load change can be reduced.

Figure 4:
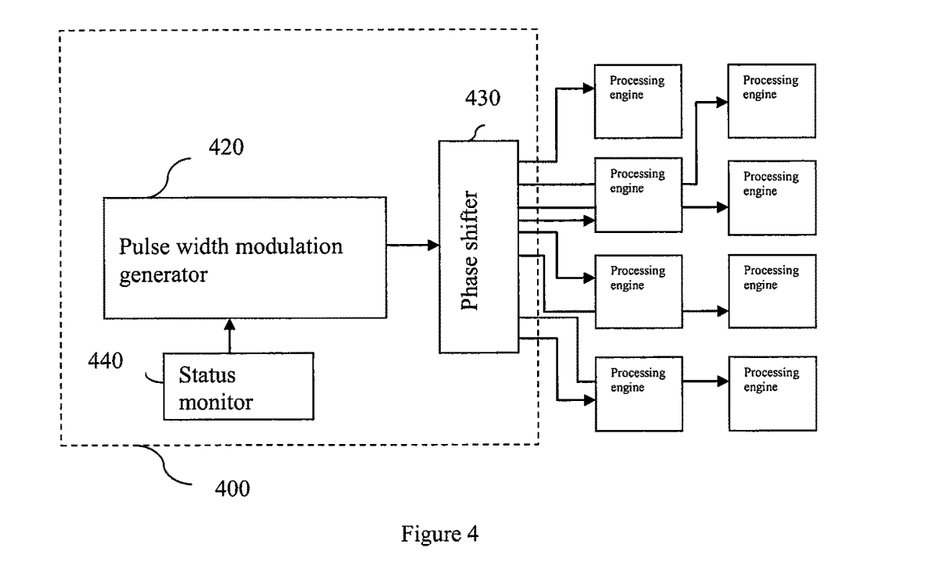
FIG. 4 illustrates a system for controlling gatings of a multi-core processor, according to another embodiment of the present invention.

FIG. 4 illustrates a system 400 for controlling gatings of a multi-core processor, according to another embodiment of the present invention. The system 400 includes a pulse width modulation generator 420 and a phase shifter 430, further including a status monitor 400 for monitoring status of a multi-core processor and generating status information based on the monitored status. Wherein, the control square wave is generated based on the status information.

It can be known from the above described generation process of the control square waves that a duty cycle of a control square wave is associated with the status of the multi-core processor. The phases of the control square waves are shifted, and then the shifted control square waves are input to the gating of each processing engine in the multi-core processor to adjust its respective enable period. The status of the multi-core processor is changed by adjusting the enable period of the processing engines. In reverse, the changed status would affect the duty cycle of the control square waves, thereby forming a cycle process similar with feedback control. After cycle control over a period of time, the status of the multi-core processor can reach a desired value. The status of the multi-core processor can be such as a temperature, a temperature growth rate, a utilization rate, and the like.

Preferably, the status monitor 400 can include a temperature monitor for monitoring a temperature of the multi-core processor and generating the status information based on the monitored temperature. The pulse width modulation generator 420 is further used for computing a temperature growth rate based on the status information. Wherein, when the temperature growth rate is larger than a threshold, a duty cycle of the control square wave is decreased; when the temperature growth rate is equal to or lower than the threshold, the duty cycle of the control square wave is increased.

The status information that is generated based on the temperature monitored by the temperature monitor can be a digital value such as a temperature value. The pulse width modulation generator 420 can further compute a temperature growth rate according to the input temperature value. When the temperature growth rate is higher than the threshold, it is illustrated that a load change on the multi-core processor is larger. In this case, the temperature growth rate can be controlled by reducing an amount of the load processed on the multi-core processor. Thus, by decreasing the duty cycle of the control square waves, the enable period of the processing engines that are enabled by the gatings of the processing engines can be decreased. Consequently the amount of the load to be processed at any time on the multi-core processor can be decreased so that the temperature growth rate can also be decreased accordingly. In this way, the temperature growth rate can be controlled within a proper range. Preferably, the range of the temperature growth rate is 0.3° C.~0.6° C. per second, which can avoid easy aging and even crack of a multi-core processor package, as well as related adverse effect, caused by a abrupt temperature growth. Likewise, when the duty cycle of the control square waves is increased, the enable period of the processing engines that are enabled by the gatings of the processing engines can be increased. Consequently more load can be simultaneously processed on the multi-core processor when a great amount of load need to be processed. The duty cycle of the control square waves can be up to 100% to sufficiently meet the requirement of the load.

Preferably, the status monitor 440 includes a load monitor for monitoring a utilization rate of at least one of the multiple processing engines and generating the status information based on the monitored utilization rate. Wherein, a duty cycle of the control square wave is adjusted based on the status information, so that a utilization rate of the multi-core processor is kept at a desired value.

As above described, the utilization rate of a processing engine is the ratio of its busy period to its enable period. The utilization of a multi-core processor can be achieved directly by monitoring the utilization rate of one processing engine or by averaging the monitored utilization rates of multiple processing engines. The enable period of a processing engine can be controlled by a control square wave via a gating, while its busy period is depended on the actual load. Thus, the utilization rate of the processing engine can be improved by changing the enable period of the processing engine. That is, the utilization can be improved by changing the duty cycle of the control square wave. The duty cycle of the control square wave is depended on an actual utilization rate because it is controlled by status information about the utilization rate. The utilization rate can be kept at a desired value by adjusting the control square wave. Preferably the utilization rate of the multi-core processor is kept at about 90%. In this case, the power can be sufficiently saved because the enable period is greatly close to the busy period; while there is still an enable period margin, approximately 10%, for use when more loads need to be processed.

Figure 5:
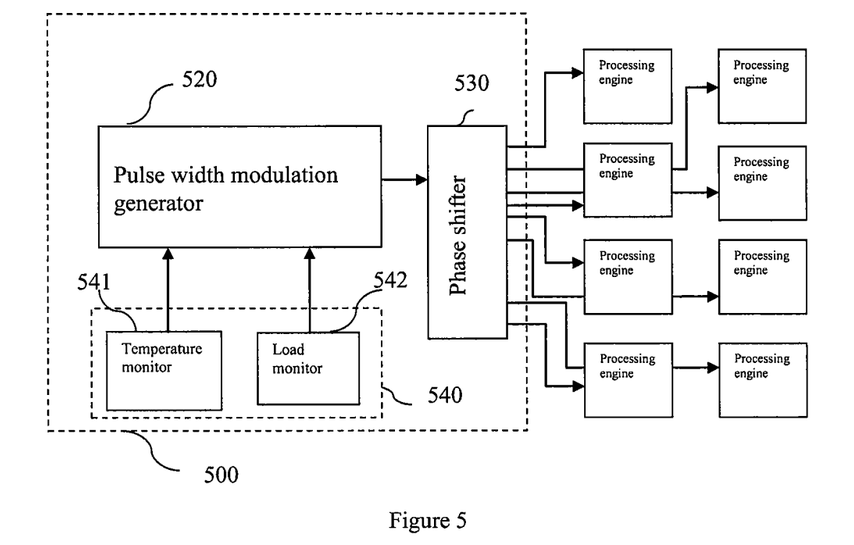
FIG. 5 illustrates a system for controlling gatings of a multi-core processor, according to still another embodiment of the present invention.

FIG. 5 illustrates a system 500 for controlling gatings of a multi-core processor, according to still another embodiment of the present invention. The system 500 includes a pulse width modulation generator 520, a phase shifter 530 and a status monitor 540 which includes a temperature monitor 541 and a load monitor 542. Wherein the temperature monitor 541 is used for monitoring a temperature of the multi-core processor and generating first status information based on the monitored temperature. The load monitor 542 is used for monitoring a utilization rate of at least one of the multiple processing engines and generating second status information based on the monitored utilization rate. And the pulse width modulation generator 520 is further used for computing a temperature growth rate based on the first status information. When the temperature growth rate is equal to or lower than a threshold, a duty cycle of the control square wave is adjusted based on the second status information, so that a utilization rate of the multi-core processor is kept at a desired value; when the temperature growth rate is larger than the threshold, the duty cycle of the control square wave is decreased.

When the temperature growth rate is equal to or lower than a threshold, it is illustrated that the load processing on a multi-core processor does not result in a significant temperature growth. Therefore, it may not be required that the enable period of processing engines is decreased to limit the load processing. As above described, the duty cycle of a control square wave is adjusted based on the second status information generated based on a monitored actual utilization rate, thereby the utilization rate is kept at a desired value. As above described, when the temperature growth rate is higher than the threshold, the duty cycle of the control square wave can be decreased, so that the enable period of the processing engines which are enabled by their gatings is decreased. As a result, the load processed on the multi-core processor can be reduced so that the temperature growth rate can be decreased with it. Thus, the temperature growth rate can be kept within a proper range.

Preferably, the load monitor 542 further includes an active processing engine counter and a utilization rate controller. The active processing engine counter is used for monitoring utilization rates of at least two of the multiple processing engines and computing a comprehensive utilization rate of the multi-core processor based on the utilization rates of the at least two of the multiple processing engines. The utilization rate controller is used for generating the second status information based on the comprehensive utilization rate. The utilization rate of the processing engines can be accurately adjusted to a desired value by computing the comprehensive utilization rate of the multi-core processor based on the monitored utilization rate of the multiple processing engines.

Figure 6:
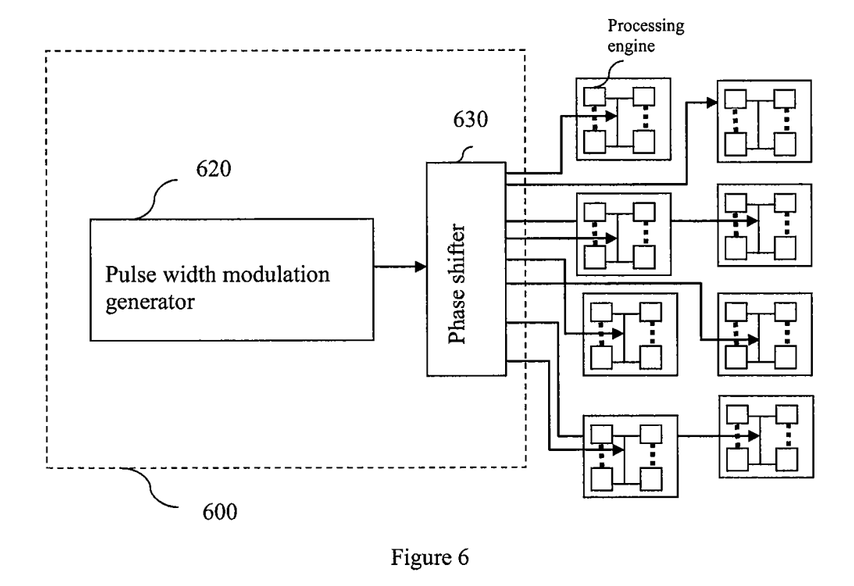
FIG. 6 illustrates a system for controlling gatings of a multi-core processor, according to still another embodiment of the present invention.

FIG. 6 illustrates a system 600 for controlling gatings of a multi-core processor, according to still other embodiment of the present invention. The system 600 includes a pulse width modulation generator 620 and a phase shifter 630. Preferably, the multiple processing engines are divided into multiple groups and each of the control square waves with the different phases is respectively used for being input to gatings of processing engines in a corresponding group. There might be thousands of processing engines within a multi-core processor. If all processing engines are controlled by control square waves with different phases, the implement of a system for controlling gatings of the multi-core processor would be greatly complicated and expensive. Thus, as for the multi-core processor with a great number of processing engines, the group control method can be employed.

Preferably, the number of the groups is eight. The phase shifter 630 is further used for shifting the phase of the control square wave to generate eight control square waves with phases which are in an arithmetic progression with a 45° common difference, and inputting each of the eight control square waves with the phases which are in the arithmetic progression with the 45° common difference to the gatings of the processing engines in the corresponding group. Since the number of processing engines is typically an integral multiple of eight, a system for controlling gatings of a multi-core processor is easily implemented by dividing the processing engines into eight groups. Although eight groups are shown in FIG. 6, the ordinary skilled persons in the art can understand that the number of groups may not be limited to eight.

The system for controlling gatings of a multi-core processor above described can either be provided as a discrete component or a chip or integrated into a multi-core processor chip.

Figure 7:
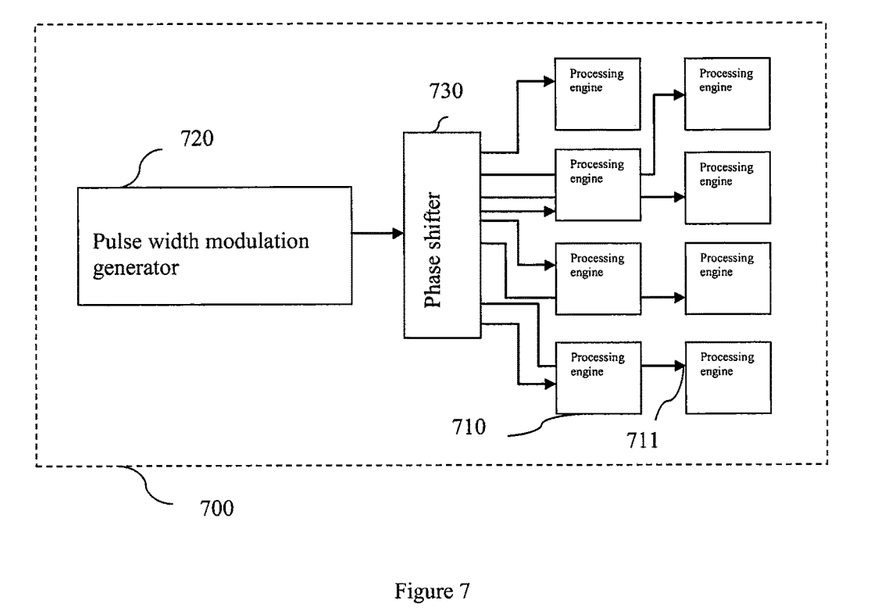
FIG. 7 illustrates a multi-core processor, according to one embodiment of the present invention.

In another aspect of the invention, a multi-core processor is provided. FIG. 7 illustrates a multi-core processor 700, according to one embodiment of the present invention. The multi-core processor 700 includes multiple processing engines 710 and a system for controlling the gating. Each processing engine includes a gating 711. The system for controlling the gating further includes the pulse width modulation generator 720 and the phase shifter 730. The pulse width modulation generator 720 is used for generating a control square wave. The phase shifter 730 is used for shifting a phase of the control square wave to generate control square waves with different phases, and respectively inputting the control square waves with the different phases to the gating of the each processing engine. The ordinary skilled persons in the art can understand that a system for controlling gatings within a multi-core processor can be any systems described refer to FIG. 1 as well as FIG. 4 to FIG. 6. For simplicity, the specific description about the system is omitted. Those skilled persons in the art can understand the specific structure and function of the system by referring to FIG. 1 to FIG. 6 and related description.

It should be appreciated that various modifications, adaptations and alternative embodiments thereof may be made within the scope and spirit of the present invention. The invention is further defined by the following claims.

The invention claimed is:

1. A system for controlling gatings of a multi-core processor, including:
   a pulse width modulation generator for generating a control square wave; and
   a phase shifter for shifting a phase of the control square wave to generate control square waves with different phases, and respectively inputting the control square waves with the different phases to a gating of each of multiple processing engines in the multi-core processor.

2. The system according to claim 1, wherein the phases of the control square waves with the different phases are different from each other.

3. The system according to claim 2, wherein the phases of the control square waves with the different phases are in an arithmetic progression.

4. The system according to claim 1, further including a status monitor for monitoring status of the multi-core processor and generating status information based on the monitored status, wherein the control square wave is generated based on the status information.

5. The system according to claim 4, wherein the status monitor includes a temperature monitor for monitoring a temperature of the multi-core processor and generating the status information based on the monitored temperature; and
   the pulse width modulation generator is further used for computing a temperature growth rate based on the status information;
   wherein, when the temperature growth rate is larger than a threshold, a duty cycle of the control square wave is decreased; when the temperature growth rate is equal to or lower than the threshold, the duty cycle of the control square wave is increased.

6. The system according to the claim 4, wherein the status monitor includes a load monitor for monitoring a utilization rate of at least one of the multiple processing engines and generating the status information based on the monitored utilization rate;
   wherein a duty cycle of the control square wave is adjusted based on the status information, so that a utilization rate of the multi-core processor is kept at a desired value.

7. The system according to the claim 4, wherein the status monitor includes a temperature monitor and a load monitor;
   wherein the temperature monitor is used for monitoring a temperature of the multi-core processor and generating first status information based on the monitored temperature;
   the load monitor is used for monitoring a utilization rate of at least one of the multiple processing engines and generating second status information based on the monitored utilization rate; and
   the pulse width modulation generator is further used for computing a temperature growth rate based on the first status information;
   wherein, when the temperature growth rate is equal to or lower than a threshold, a duty cycle of the control square wave is adjusted based on the second status information, so that a utilization rate of the multi-core processor is kept at a desired value; when the temperature growth rate is larger than the threshold, the duty cycle of the control square wave is decreased.

8. The system according to claim 7, wherein the load monitor further includes:
   an active processing engine counter for monitoring utilization rates of at least two of the multiple processing engines and computing a comprehensive utilization rate of the multi-core processor based on the utilization rates of the at least two of the multiple processing engines;
   a utilization rate controller for generating the second status information based on the comprehensive utilization rate.

9. The system according to claim 1, wherein the multiple processing engines are divided into multiple groups and each of the control square waves with the different phases is respectively used for being input to gatings of processing engines in a corresponding group.

10. The system according to claim 9, wherein the number of the groups is eight;

and the phase shifter is further used for shifting the phase of the control square wave to generate eight control square waves with phases which are in an arithmetic progression with a 45° common difference, and inputting each of the eight control square waves with the phases which are in the arithmetic progression with the 45° common difference to the gatings of the processing engines in the corresponding group.

11. The system of claim 1, wherein the phase shifter is configured to:

receive status information including a temperature corresponding to the multicore processor and a utilization growth rate corresponding to the multi-core processor;

adjust phases of the control square waves based on the status information; and apply the control square waves to the multiple processing engines to control the gatings of each processing engine included in the multi-core processor.

12. A multi-core processor, including:

multiple processing engines, wherein each processing engine includes a gating;

a system for controlling the gating, further including a pulse width modulation generator for generating a control square wave; and a phase shifter for shifting a phase of the control square wave to generate control square waves with different phases, and respectively inputting the control square waves with the different phases to control the gating of the each processing engine, wherein, for each processing engine included in the multiple processing engines, a gating corresponding to the processing engine controls whether the processing engine is enabled or disabled.

13. The multi-core processor according to claim 12, wherein the phases of the control square waves with the different phases are different from each other.

14. The multi-core processor according to claim 13, wherein the phases of the control square waves with the different phases are in an arithmetic progression.

15. The multi-core processor according to claim 12, wherein the system for controlling the gating further includes:

a status monitor for monitoring status of the multi-core processor and generating status information based on the monitored status, wherein the control square wave is generated based on the status information.

16. The multi-core processor according to claim 15, wherein the status monitor includes a temperature monitor for monitoring a temperature of the multi-core processor and generating the status information based on the monitored temperature; and the pulse width modulation generator is further used for computing a temperature growth rate based on the status information;

wherein, when the temperature growth rate is larger than a threshold, a duty cycle of the control square wave is decreased; when the temperature growth rate is equal to or lower than the threshold, the duty cycle of the control square wave is increased.

17. The multi-core processor according to the claim 15, wherein the status monitor includes a load monitor for monitoring a utilization rate of at least one of the multiple processing engines and generating the status information based on the monitored utilization rate;

wherein a duty cycle of the control square wave is adjusted based on the status information, so that a utilization rate of the multi-core processor is kept at a desired value.

18. The multi-core processor according to the claim 15, wherein the status monitor includes a temperature monitor and a load monitor;

wherein the temperature monitor is used for monitoring a temperature of the multi-core processor and generating first status information based on the monitored temperature;

the load monitor is used for monitoring a utilization rate of at least one of the multiple processing engines and generating second status information based on the monitored utilization rate; and the pulse width modulation generator is further used for computing a temperature growth rate based on the first status information;

wherein, when the temperature growth rate is equal to or lower than a threshold, a duty cycle of the control square wave is adjusted based on the second status information, so that a utilization rate of the multi-core processor is kept at a desired value; when the temperature growth rate is larger than the threshold, the duty cycle of the control square wave is decreased.

19. The multi-core processor according to claim 18, wherein the load monitor further includes:

an active processing engine counter for monitoring utilization rates of at least two of the multiple processing engines and computing a comprehensive utilization rate of the multi-core processor based on the utilization rates of the at least two of the multiple processing engines;

a utilization rate controller for generating the second status information based on the comprehensive utilization rate.

20. The multi-core processor according to claim 12, wherein the multiple processing engines are divided into multiple groups and each of the control square waves with the different phases is respectively input to gatings of processing engines in a corresponding group.

21. The multi-core processor according to claim 20, wherein the number of the groups is eight;

and the phase shifter is further used for shifting the phase of the control square wave to generate eight control square waves with phases which are in an arithmetic progression with a 45° common difference, and inputting each of the eight control square waves with the phases which are in the arithmetic progression with the 45° common difference to the gatings of the processing engines in the corresponding group.

* * * * *

UNITED STATES PATENT AND TRADEMARK OFFICE
CERTIFICATE OF CORRECTION

PATENT NO.        : 10,038,430 B2                             Page 1 of 1
APPLICATION NO.   : 13/747023
DATED             : July 31, 2018
INVENTOR(S)       : Shuang Xu It is certified that error appears in the above-identified patent and that said Letters Patent is hereby corrected as shown below:

On the Title Page

Item (54) and in the Specification, Column 1, Lines 1-2, Title:
Please delete "SYSTEM FOR CONTROLLIING GATINGS OF A MULTICORE PROCESSOR" and insert --SYSTEM FOR CONTROLLING GATINGS OF A MULTI-CORE PROCESSOR--;

In the Claims

Column 9, Claim 1, Line 65, please insert --control-- after to;

Column 9, Claim 1, Lines 66-67, please delete "processor." and insert
--processor,
wherein, for each processing engine included in the multiple processing engines, a gating corresponding to the processing engine controls whether the processing engine is enabled or disabled.--.

Signed and Sealed this
Thirteenth Day of November, 2018

Andrei Iancu
*Director of the United States Patent and Trademark Office*